(12) United States Patent
Leonowich et al.

(10) Patent No.: US 7,496,168 B2
(45) Date of Patent: Feb. 24, 2009

(54) PHASE-LOCKED LOOP USING MULTI-PHASE FEEDBACK SIGNALS

(75) Inventors: Robert H. Leonowich, Fleetwood, PA (US); Zailong Zhuang, Whitehall, PA (US)

(73) Assignee: Agere Systems Inc., Allentown, PA (US)

( * ) Notice: Subject to any disclaimer, the term of this patent is extended or adjusted under 35 U.S.C. 154(b) by 610 days.

(21) Appl. No.: 11/115,671

(22) Filed: Apr. 27, 2005

(65) Prior Publication Data

US 2006/0245531 A1 Nov. 2, 2006

(51) Int. Cl.
*H03D 3/24* (2006.01)
(52) U.S. Cl. .................. 375/376; 375/373; 375/374; 375/375; 327/156; 327/158
(58) Field of Classification Search ......... 375/373–376, 375/327; 327/156, 158
See application file for complete search history.

(56) References Cited

U.S. PATENT DOCUMENTS 6,424,192 B1 * 7/2002 Lee et al. .................. 327/156
7,283,002 B2 * 10/2007 Puma et al. ................. 331/16

OTHER PUBLICATIONS

"A 1.8-Ghz Self-Calibrated Phase-Locked-Loop with Precise I/Q Matching," by Chan-Hong Park et al., IEEE Journal of Solid-State Circuits, vol. 36, No. 5, May 2001, pp. 777-783.
"Fractional/Integer-N PLL Basics," Texas Instruments, Technical Brief SWRA029, Aug. 1999, pp. 31-40.

* cited by examiner

*Primary Examiner*—Phuong Phu
(74) *Attorney, Agent, or Firm*—Mendelsohn & Associates, P.C.; Steve Mendelsohn (57) ABSTRACT

A signal generator, such as a fractional-N PLL, has, in its feedback signal path, a divider, a phase circuit, and a fractional accumulator that generates control signals for the divider and the phase circuit. The divider control signal controls the divisor value applied by the divider. In one embodiment, a phase selector selects, based on the phase-circuit control signal, one of a plurality of phase-shifted output signals generated by the PLL's main signal path (e.g., by a multi-phase VCO) and the divider generates the feedback signal for the PLL from the selected signal. In another embodiment, the divider generates a divided signal from one of the phase-shifted output signals, and a phase mixer generates, from the divided signal, a plurality of phase-shifted divided signals and selects, based on the phase-circuit signal, one of the phase-shifted divided signals as the PLL's feedback signal.

24 Claims, 6 Drawing Sheets

PHASE-LOCKED LOOP USING MULTI-PHASE FEEDBACK SIGNALS

BACKGROUND OF THE INVENTION

1. Field of the Invention

The present invention relates to electronic circuits, and, in particular, to signal generators, such as phase-locked loops.

2. Description of the Related Art

In many electronics applications, digital circuits are employed that operate with one or more clock signals. Personal computers commonly employ a processor that may operate based on a clock having a frequency of 350 MHz, and 1 GHz frequencies are becoming common. However, at such high frequencies, these digital circuits may radiate signals as electromagnetic energy, and these electromagnetic emissions may interfere with the operation of surrounding equipment. Since these emissions are based upon clock signals, high emitted energy "spikes" occur at these clock signal frequencies and their harmonics. Consequently, equipment is often shielded to prevent or minimize these emissions within certain frequency ranges, or operation is modified to spread the emitted energy over a wider frequency range, thereby decreasing the energy at any given frequency. One technique for modifying the operation of a digital circuit is to vary the clock frequency over a range of frequencies such that the average frequency is the desired clock frequency, but the emitted energy is now "spread" over the range of frequencies. Such variation of the clock is termed "spread spectrum" and reduces the interference from high-energy spikes at the clock frequency.

A synthesizer generating one or more clock signals often employs a phase-locked loop (PLL). A PLL is a circuit that generates a periodic output signal that has a constant phase and frequency with respect to a periodic input signal. PLLs are widely used in many types of measurement, microprocessor, and communication applications. One type of phase-locked loop is the charge-pump PLL, which is described in Floyd M. Gardner, "Charge-Pump Phase-Lock Loops," IEEE Trans. Commun., vol. COM-28, pp. 1849-1858, November 1980, the teachings of which are incorporated herein by reference. In many applications, the frequency of the output signal is higher than the frequency of the input signal.

Figure 1:
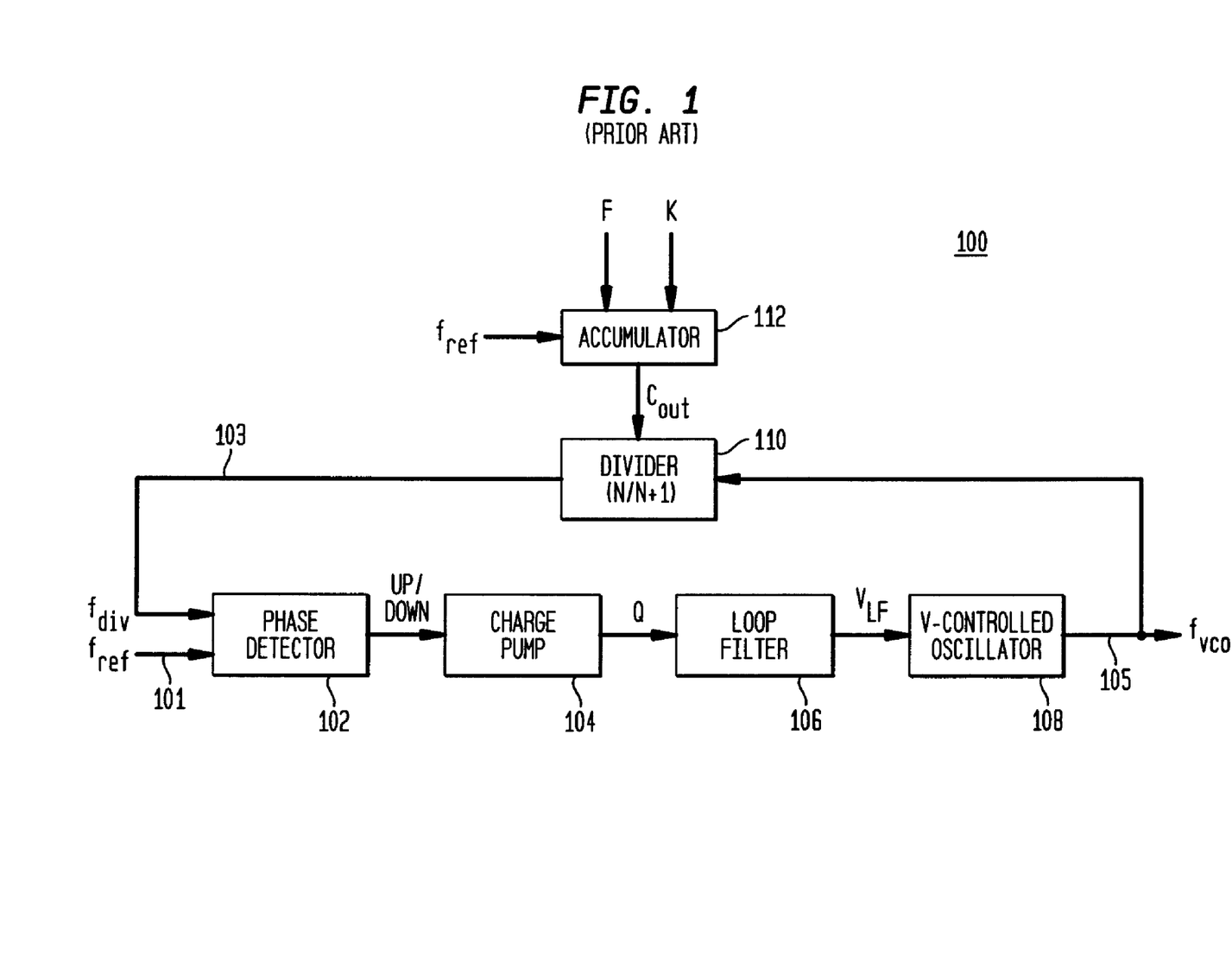
FIG. 1 shows a block diagram of a conventional fractional-N charge-pump phase-locked loop (PLL)

FIG. 1 shows a block diagram of a conventional fractional-N charge-pump phase-locked loop (PLL) 100. PLL 100 has a main signal path consisting of phase detector (PD) 102, charge pump 104, loop filter 106, and voltage-controlled oscillator (VCO) 108 and a feedback signal path consisting of feedback divider 110 controlled by accumulator 112. PD 102 compares the phase of an input reference clock signal 101 having frequency $f_{ref}$ to the phase of a feedback signal 103 having frequency $f_{div}$. Based on the comparison, PD 102 generates an error signal: either an UP signal (when the phase of reference signal 101 leads the phase of feedback signal 103) or a DOWN signal (when the phase of reference signal 101 lags the phase of feedback signal 103), where the magnitude of the error signal indicates the magnitude of the phase difference between the two signals. Charge pump 104 generates an amount of positive or negative charge Q based on the error signal from PD 102 and applies that charge to loop filter 106, which operates as an integrator that accumulates the net charge from the charge pump. The resulting loop-filter voltage $V_{LF}$ is applied to VCO 108, which generates a periodic VCO output signal 105, whose frequency $f_{vco}$ is a function of the applied loop-filter voltage, where the VCO output signal is the synthesized output signal of PLL 100.

VCO output signal 105 is also applied to feedback divider 110, which generates feedback signal 103 by dividing the VCO output signal by either integer value N or integer value N+1, depending on whether the value of carry-out control signal $C_{out}$ from accumulator 112 is a 0 or a 1, respectively. Accumulator 112 receives fractional control input values K and F, which are used to generate the divider control signal $C_{out}$. In particular, at each clock cycle of reference signal 101, accumulator 112 increments a counter by K/F, where K and F are both integers and K<F. Whenever the accumulator counter rolls over to the next integer, accumulator 112 sets carry-out signal $C_{out}$ to 1 for the next clock cycle. As such, the frequency $f_{vco}$ of VCO output signal 105 is related to the frequency $f_{ref}$ of reference signal 101 according to Equation (1) as follows:

$$f_{vco}=f_{ref}*(N+K/F), \quad (1)$$

where the value K/F determines the fractional value of the reference signal $f_{ref}$. Any fractional value can be achieved by selecting appropriate values for K and F.

One drawback to this technique is that feedback divider 110 will jump from N to N+1 whenever accumulator 112 generates consecutive carry-out values $C_{out}$ of 0 and 1, respectively. Similarly, feedback divider 110 will jump from N+1 to N whenever accumulator 112 generates consecutive carry-out values of 1 and 0, respectively. In both cases, a relatively large spur is created at $(K/F)*f_{ref}$.

Another drawback to this technique is that the fractional spur is worse for small or large values of K/F (i.e., close to 0 or close to 1, respectively) than for intermediate values (i.e., close to ½). In these cases, loop filter 106 having a fixed loop bandwidth is less effective at filtering out the periodic phase hit, resulting in larger fractional spurs.

Another technique for achieving a PLL with fractional resolution is to use a VCO that generates F output signals having the same frequency but different phases, where the phase offset between each different consecutive pair of output signals is the same. A PLL having a fractional resolution of 1/F can be achieved by sequentially selecting from among the F different VCO output signals. One drawback to this technique is that the fractional resolution of the PLL is limited based on the number of output signals generated by the VCO.

SUMMARY OF THE INVENTION

In one embodiment, the present invention is a signal generator comprising a main signal path and a feedback signal path. The main signal path is adapted to generate, based on a feedback signal, a plurality of phase-shifted output signals. The feedback signal path is adapted to generate the feedback signal for the main signal path. The feedback signal path comprises a divider, a phase circuit, and an accumulator. The divider is adapted to divide a divider input signal by a divisor value to generate a divider output signal. The phase circuit is adapted to select a phase-circuit output signal from a plurality of phase-shifted signals. The accumulator is adapted to generate (1) a divider control signal for controlling selection of the divisor value used by the divider and (2) a phase-circuit control signal for controlling selection of the phase-circuit output signal by the phase circuit.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 2:
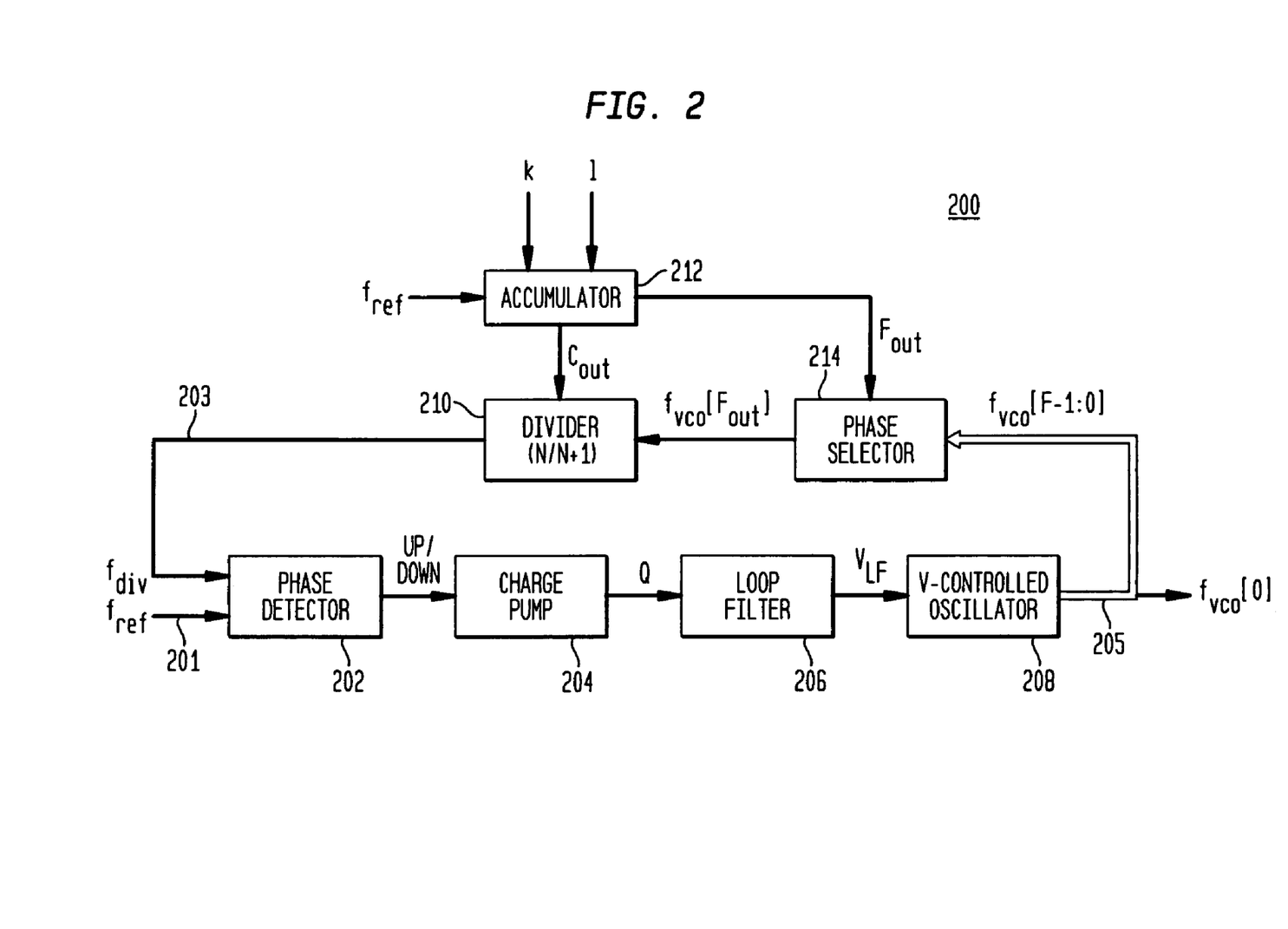
FIG. 2 shows a block diagram of an exemplary embodiment of a fractional-N PLL, in which phase selection is implemented before the feedback division operation.

FIG. 2 shows a block diagram of an exemplary embodiment of a fractional-N PLL 200. PLL 200 has a main signal path consisting of PD 202, charge pump 204, loop filter 206, and VCO 208 and a feedback signal path consisting of phase selector 214 and feedback divider 210 controlled by fractional accumulator 212. PD 202, charge pump 204, loop filter 206, VCO 208, feedback divider 210, and fractional accumulator 212 of PLL 200 are analogous to corresponding elements in PLL 100 of FIG. 1. In fact, PD 202, charge pump 204, loop filter 206, and feedback divider 210 may be identical to the corresponding elements in FIG. 1. The differences between PLL 200 of FIG. 2 and PLL 100 of FIG. 1 lie in the operations of VCO 208 and fractional accumulator 212 and the existence of phase selector 214.

Unlike VCO 108 of FIG. 1, which generates a single VCO output signal 105 whose frequency $f_{vco}$ is a function of the applied loop-filter voltage, VCO 208 of FIG. 2 generates F VCO output signals 205, each having the same frequency $f_{vco}$ (based on the applied loop-filter voltage) but different phase, where the phase difference between each consecutive pair of VCO output signals is $2\pi/F$, where F is an integer greater than 1. As shown in FIG. 2, one of the F VCO output signals (e.g., $f_{vco}[0]$) is selected as the synthesized output signal for PLL 200.

All F VCO output signals $f_{vco}[F-1:0]$ are applied to phase selector 214, which selects, based on control signal $F_{out}$ from fractional accumulator 212, one of those F signals, $f_{vco}[F_{out}]$, to be divided (i.e., by N or N+1) by feedback divider 210 to generate feedback signal 203 having frequency $f_{div}$, which is applied to PD 202 along with reference signal 201 having frequency $f_{ref}$.

Although fractional-N PLL 200 of FIG. 2 relies on VCO 208 to generate the F phase-shifted signals, in other exemplary embodiments, the F phase-shifted signals can be generated in other ways. For example, the output from a single-output VCO could be phase interpolated to generate another F−1 phase-shifted signals. In another example, phase-shifted signals could be generated by picking off signals at the outputs of different delay stages within a delay-locked loop (DLL).

Similarly, although fractional-N PLL 200 of FIG. 2 is a charge-pump PLL, other exemplary embodiments can be implemented in other linear PLL topologies. Also, this technique can be used in other applications, including other types of PLLs, such as spread spectrum PLLs, clock synthesizers, data communications, and disc drives.

Figure 3:
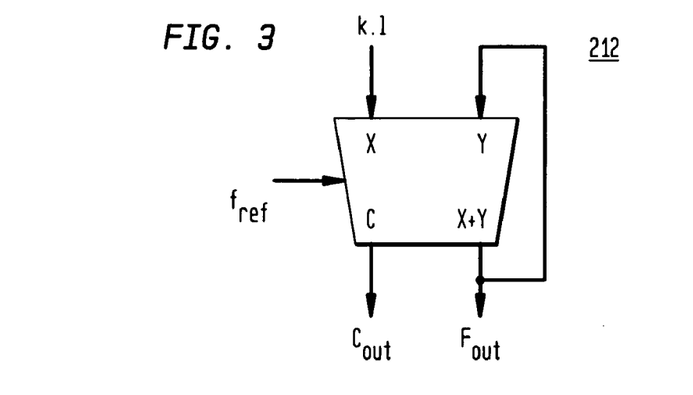
FIG. 3 shows an exemplary implementation of the fractional accumulator of FIG. 2.

FIG. 3 shows an exemplary implementation of fractional accumulator 212 of FIG. 2 that relies on a digital "up" accumulator. In this particular implementation, the two control signals k and l applied to fractional accumulator 212 correspond to the integer and fractional parts, respectively, of the value X=k.l by which the accumulator counter value Y is incremented at every clock cycle of the reference signal $f_{ref}$. The integer part of the remainder of the integer division operation (Y+X)/F, where F is the number of VCO phases and X<F, is output as the phase-select control signal $F_{out}$. Note that only the remainder of the integer division operation needs to be retained as the accumulator counter value Y for the next clock cycle.

Table I shows an exemplary implementation of fractional accumulator 212, where F=8, k=2, and l=4, such that X=k.l=2.4. For example, at Cycle 6, X+Y=14.4, the remainder of the integer division operation (Y+X)/F=14.4/8=6.4, and the integer part of that remainder is $F_{out}$=6. Thus, in this example, phase selector 214 selects VCO output signal $f_{vco}[2]$ at Cycle 1, VCO output signal $f_{vco}[4]$ at Cycle 2, and so on.

TABLE I

Exemplary Fractional Accumulator Implementation

| | Cycle | | | | | | | | |
|---|---|---|---|---|---|---|---|---|---|
| | 1 | 2 | 3 | 4 | 5 | 6 | 7 | 8 | ... |
| X + Y | 2.4 | 4.8 | 7.2 | 9.6 | 12.0 | 14.4 | 16.8 | 19.2 | ... |
| $F_{out}$ | 2 | 4 | 7 | 1 | 4 | 6 | 0 | 3 | ... |
| $C_{out}$ | 0 | 0 | 0 | 1 | 0 | 0 | 1 | 0 | |

As indicated in Table I, when the value of $F_{out}$ "rolls over" (e.g., from 7 at Cycle 3 to 1 at Cycle 4 and from 6 at Cycle 6 to 0 at Cycle 7), fractional accumulator 212 sets the carry-out signal $C_{out}$ to 1 to instruct feedback divider 210 to divide by N+1 for the corresponding reference clock cycle. This insures, for example, that the divided feedback signal $f_{div}$ corresponds to the next phase 1 at Cycle 4 rather than the current phase 1 to keep a constant positive accumulation slope.

The fractional-N PLL technique of FIG. 2 controls both the feedback divider value as well as the phase of the VCO output signal selected to be divided by that value to achieve a continuous moving excess phase $\phi_e$ at the PD input. The excess phase accumulates over time, with the accumulation slope controlled by the transition density factor den, where den=k.l in the exemplary embodiment of FIG. 3. The relationship between the excess phase $\phi_e$ and the transition density factor den is given by Equation (2) as follows:

$$\phi_e = \frac{\frac{1}{F} * den * 2\pi}{N} * \frac{t}{t_{ref}}, \tag{2}$$

where t is the elapsed time and $t_{ref}$ is the reference clock cycle period. In the settled state, PLL 200 of FIG. 2 will respond only to excess phase, since static phase is effectively tracked out by the relatively large negative loop gain.

An input reference frequency offset $\Delta f_{in}$ is defined to be proportional to the derivative of the excess phase $\phi_e$ with respect to time, as given by Equation (3) as follows:

$$\Delta f_{in} = \frac{d\phi_e}{dt} * \frac{1}{2\pi} = \frac{den}{F} * \frac{1}{N} * \frac{1}{t_{ref}}. \quad (3)$$

The equivalent change in the output frequency, $\Delta f_{vco}$, due to the excess phase $\phi_e$ is given by Equation (4) as follows:

$$\Delta f_{vco} = \Delta f_{in} * N = \frac{den}{F} * f_{ref}. \quad (4)$$

Thus, the final VCO output frequency $f_{vco}$ is given by Equation (5) as follows:

$$f_{vco} = f_{ref} * N + \Delta f_{vco} = \left(N + \frac{den}{F}\right) * f_{ref}. \quad (5)$$

From Equation (5), the effective divisor value $N_{eff}$ can be given by Equation (6) as follows:

$$N_{eff} = N + \frac{den}{F} = N + N_f, \quad (6)$$

where $N_f$ is the fractional part of the feedback divisor value, which is a function of the phase transition density factor den and the number F of VCO output phases.

By selecting appropriate values for k and l, any desired value for phase transition density den can be achieved, where den<F. As such, any fractional value of the reference frequency $f_{ref}$ can be synthesized by PLL 200 of FIG. 2.

When the phase transition density is an integer (i.e., l=0), feedback divider 210 of FIG. 2 behaves like a non-integer divider with a resolution of k/F of the reference signal frequency $f_{ref}$. In this case, the maximum phase hit is equal to the maximum phase mismatch between two consecutively selected VCO output phases. When den is not an integer (i.e., l≠0), feedback divider 210 behaves like a fractional divider with a resolution of l/F of the reference signal frequency $f_{ref}$. In this case, the maximum phase hit is only 1/F of the VCO period plus the maximum phase mismatch between two consecutively selected VCO output signals. In either case, the maximum phase hit is much smaller than one VCO period, which results in a much smaller fractional spur than the equivalent implementation of prior-art PLL 100 of FIG. 1. In addition, the transition density factor den is clocked by the reference clock. As such, the loop filter will attenuate more effectively on the periodic phase hit, thus further reducing the fractional spur.

The previous discussion applies to incremental continuous phase change at the PD input, which corresponds to "up" fractional control. Fractional-N PLLs can also be implemented with decreasing continuous phase change where the effective fractional divisor $N_{eff}$ is given by Equation (7) as follows:

$$N_{eff} = N - \frac{den}{F} = N - N_f. \quad (7)$$

In this case, instead of using an "up" accumulator, such as fractional accumulator 212 of FIG. 3, to increment an accumulator count value, a "down" accumulator may be used to decrement an accumulator count value. When the resulting phase-select control signal $F_{out}$ rolls over in the negative direction (e.g., from 0 to 7 for F=8), a borrow output signal is asserted (rather than the carry output signal $C_{out}$ of FIGS. 2 and 3) to the feedback divider, which changes the divisor value from N to N−1 for the corresponding clock cycle in order to achieve a continuous negative phase change at the PD input. Those skilled in the art will understand that the term "accumulator increment value" used in the claims is intended to cover both accumulator increment values and accumulator decrement values.

In fractional-N PLL 200 of FIG. 2, phase selection is implemented prior to the feedback division operation. Fractional-N PLLs can also be implemented where phase selection is implemented after the feedback division operation.

Figure 4:
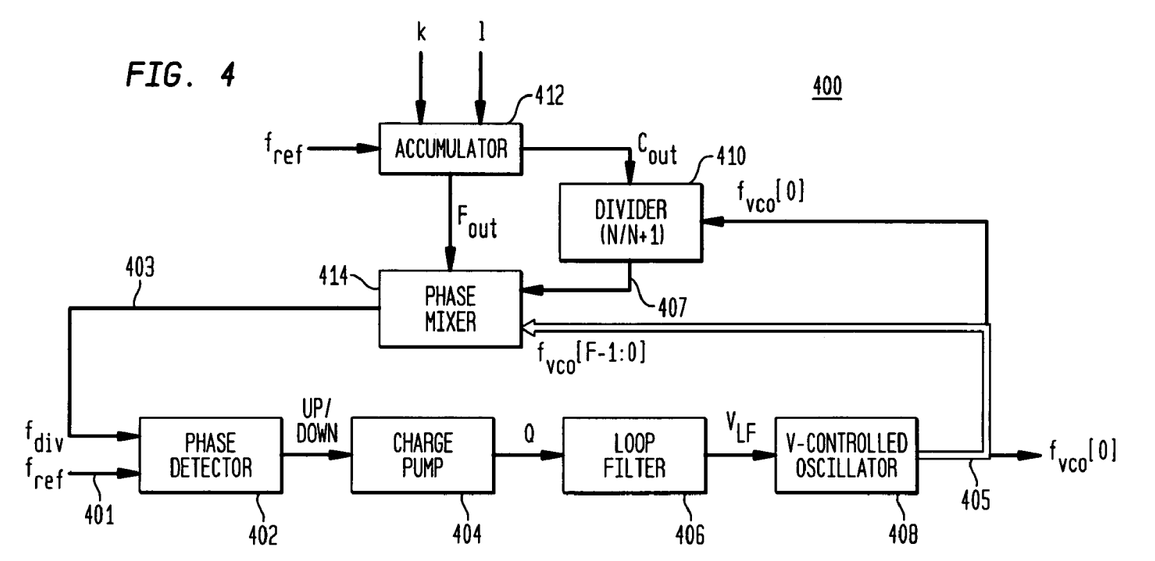
FIG. 4 shows a block diagram of an exemplary embodiment of a fractional-N PLL, in which phase selection is implemented after the feedback division operation.

FIG. 4 shows a block diagram of an exemplary embodiment of fractional-N PLL 400, in which phase selection is implemented after the feedback division operation. PLL 400 has a main signal path consisting of PD 402, charge pump 404, loop filter 406, and VCO 408 and a feedback signal path consisting of feedback divider 410 and phase mixer 414 controlled by fractional accumulator 412. PD 402, charge pump 404, loop filter 406, VCO 408, feedback divider 410, and fractional accumulator 412 of PLL 400 are analogous and may even be identical to the corresponding elements in PLL 200 of FIG. 2. The main difference between PLL 400 of FIG. 4 and PLL 200 of FIG. 2 is that PLL 200 has phase selector 214 located upstream of divider 210 in the PLL feedback loop, while PLL 400 has phase mixer 414 located downstream of divider 410 in the PLL feedback loop.

As shown in FIG. 4, the same VCO output signal (e.g., $f_{vco}[0]$) is always applied to feedback divider 410. The resulting divided signal 407 generated by feedback divider 410 is applied to phase mixer 414 along with all F of the VCO output signals 405 of $f_{vco}[F-1:0]$ generated by VCO 408. In certain implementations, phase mixer 414 uses the divided signal 407 and the F VCO output signals to generate F phase-offset versions of divided signal 407 and then uses the phase-select control signal $F_{out}$ to select one of those F divided signals to be applied to PD 402 as feedback signal 403, along with reference signal 401 having frequency $f_{ref}$. Since the F divided signals have a lower frequency than the original F VCO output signals, it may be easier to implement the phase-selection step after the feedback divider (as in FIG. 4) than before (as in FIG. 2).

Figure 5:
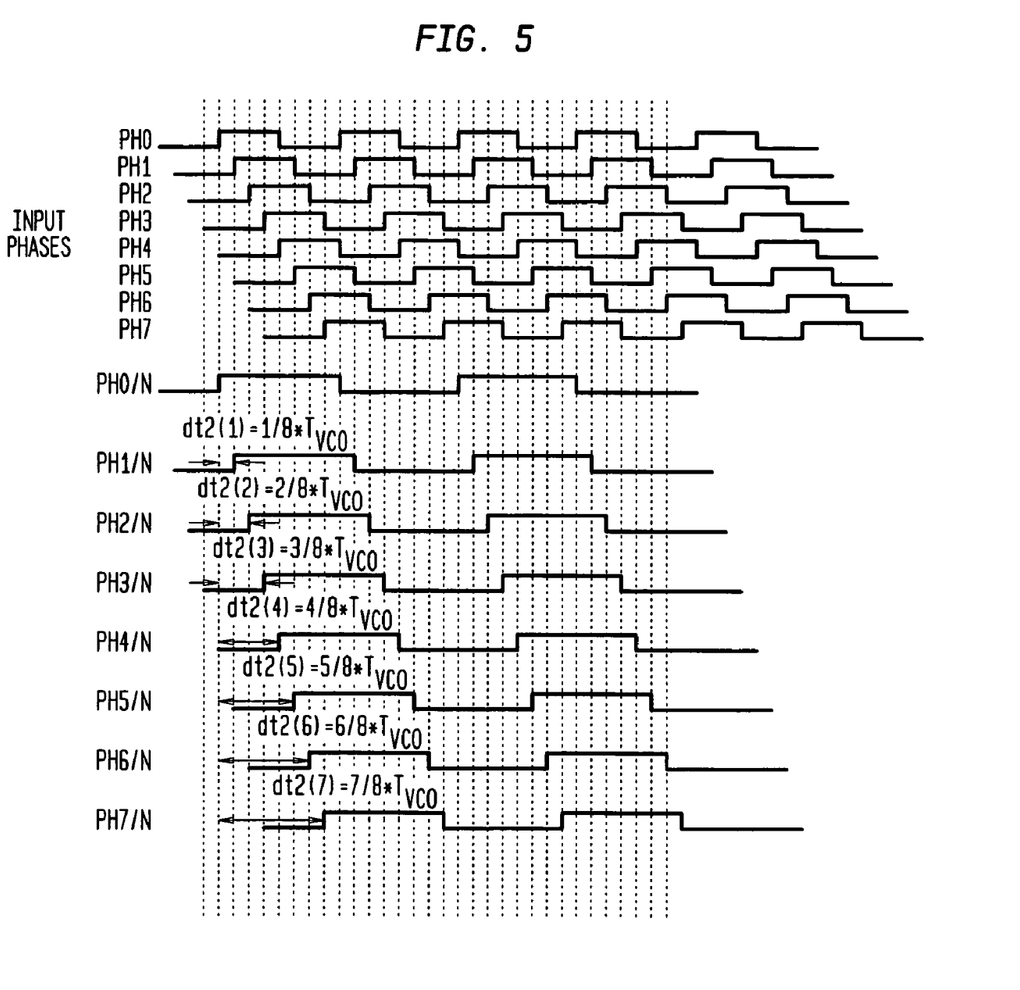
FIG. 5 represents timing diagrams illustrating resulting performance from one possible implementation of the phase mixer of FIG. 4 that employs one-stage sampling to generate F=8 phase-offset divided signals where N=2.

FIG. 5 represents timing diagrams illustrating resulting performance from one possible implementation of phase mixer 414 that employs one-stage sampling to generate F=8 phase-offset divided signals where N=2. In FIG. 5, PHi represents the ith VCO output signal $f_{vco}[i]$, PHi/N represents the ith divided signal, and $T_{vco}$ represents the period of the VCO output signals, where PH0/N is generated by feedback divider 410 and the other seven divided signals are generated by phase mixer 414. In particular, each divided signal PHi/N, i=1, . . . , 7, can be obtained, for example, by (1) using the phase of VCO output signal PHi to sample the divided signal PH0/N or (2) sequentially sampling signal PH(i−1) using the phase of signal PHi. One drawback to these single-stage implementations is that the worst-case setup time is (1/F)*$T_{vco}$, which makes it more difficult to implement phase mixer 414 for higher VCO output signal frequencies (i.e., smaller values of $T_{vco}$).

Figure 6:
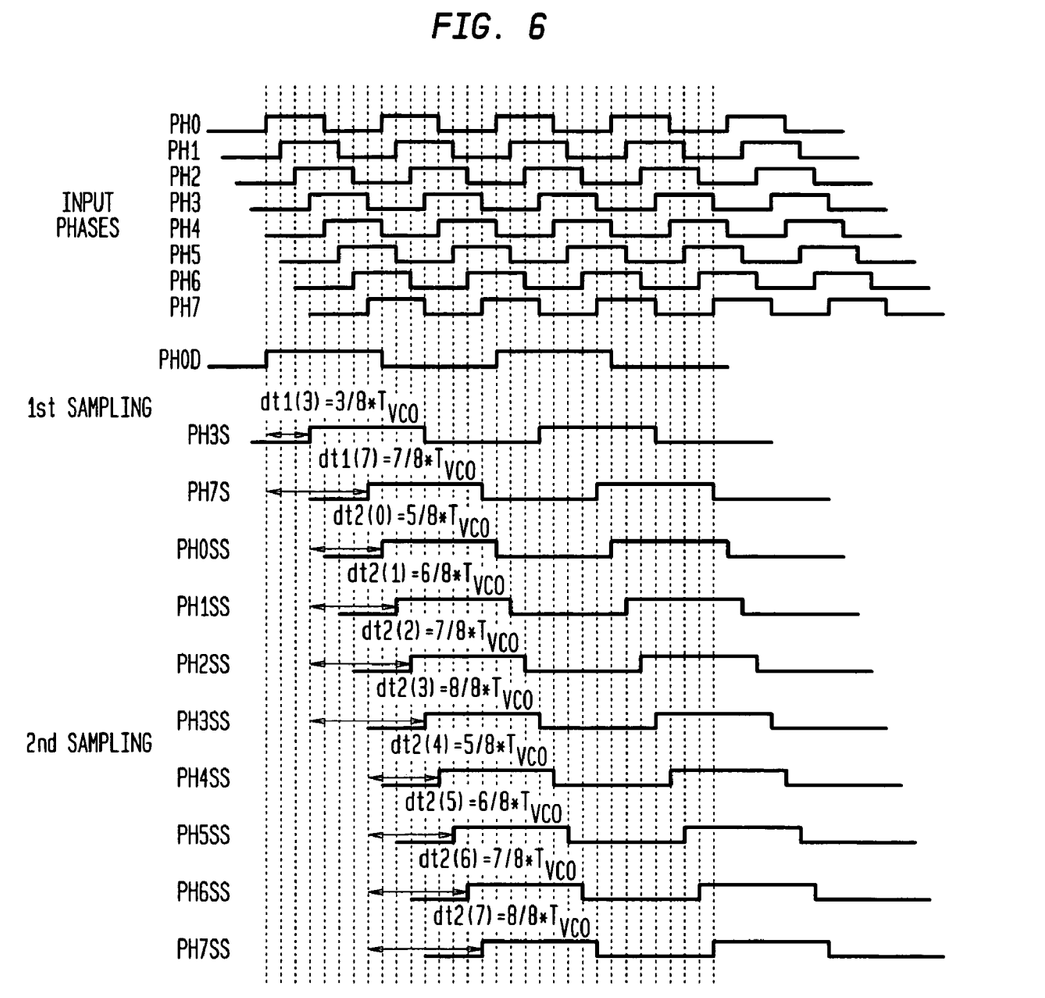
FIG. 6 represents timing diagrams illustrating resulting performance from another possible implementation of the phase mixer of FIG. 4 that employs two-stage sampling to generate F=8 phase-offset divided signals where N=2.

FIG. 6 represents timing diagrams illustrating resulting performance from another possible implementation of phase mixer 414 that employs two-stage sampling to generate F=8 phase-offset divided signals where N=2. In this implementation, phase mixer 414 implements two stages of sampling: a first stage in which two signals PH3S and PH7S are generated and a second stage in which eight signals PHiSS, i=0, . . . , 7, are generated.

In the first sampling stage, phase mixer 414 uses the phase of VCO output signal $f_{vco}$[F/2−1] (i.e., PH3) to sample the divided signal PH0D (407) from feedback divider 410 to generate sampled signal PH3S. Similarly, phase mixer 414 uses the phase of VCO output signal $f_{vco}$[F−1] (i.e., $f_{vco}$[7]) to sample the divided signal PH0D to generate sampled signal PH7S.

In the second sampling stage, phase mixer 414 uses the phase of each of VCO output signals PH0, PH1, PH2, and PH3 to sample the first-sampled signal PH3S to generate each of second-sampled signals PH0SS, PH1SS, PH2SS, and PH3SS, respectively. Similarly, phase mixer 414 uses the phase of each of VCO output signals PH4, PH5, PH6, and PH7 to sample the first-sampled signal PH7S to generate each of second-sampled signals PH4SS, PH5SS, PH6SS, and PH7SS, respectively.

In this two-stage implementation, the worst-case setup time is ((F/2−1)F)*$T_{vco}$, which is (F/2−1) times longer than the worst-case setup time for the single-stage implementation of FIG. 5. As such, it is easier to implement phase mixer 414 for comparable VCO output signal frequencies.

Figure 7:
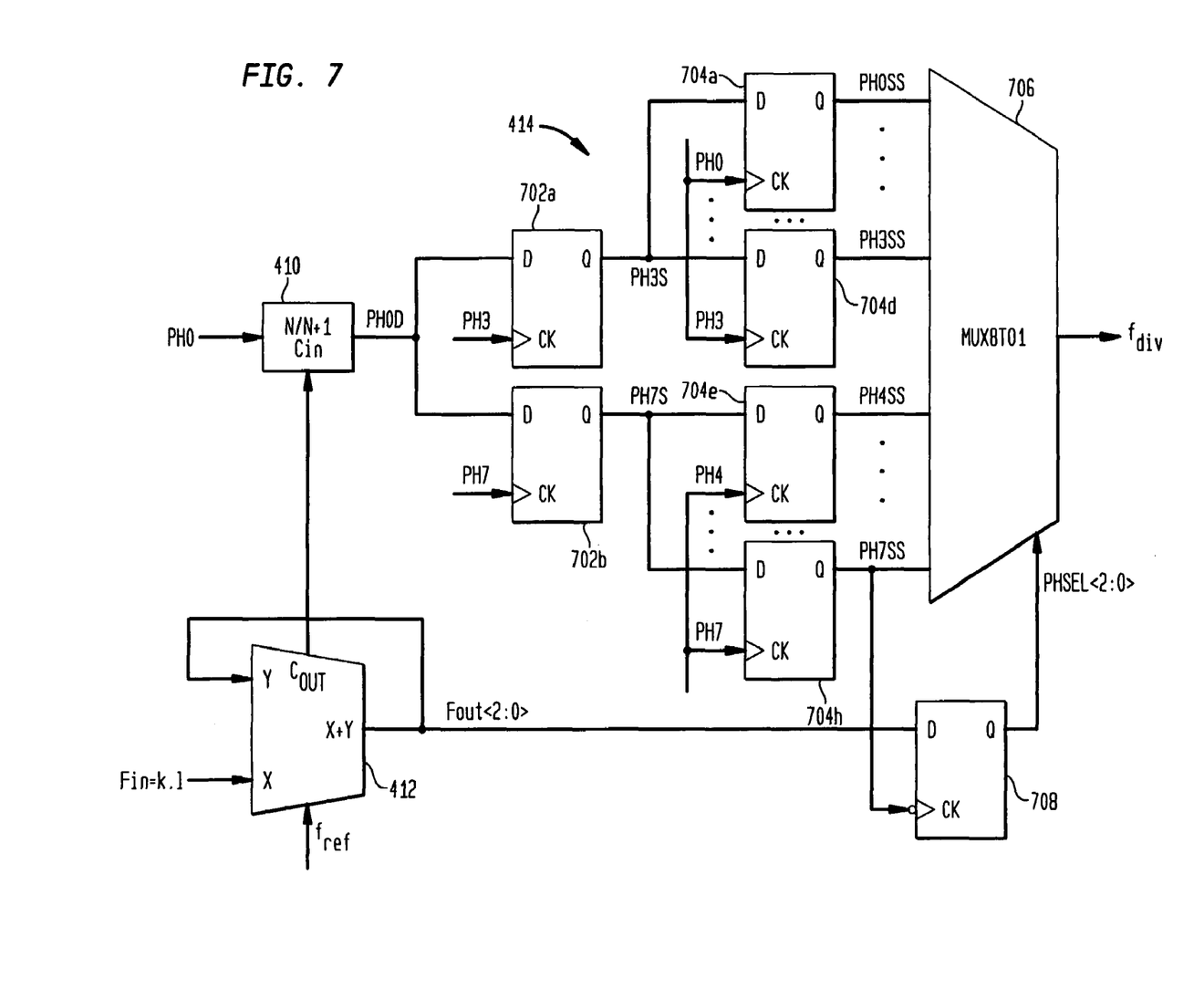
FIG. 7 shows a circuit block diagram of an exemplary implementation of the divider, fractional accumulator, and phase mixer of FIG. 4, in which the phase mixer implements two-stage sampling as in FIG. 6.

FIG. 7 shows a circuit block diagram of an exemplary implementation of divider 410, fractional accumulator 412, and phase mixer 414 of FIG. 4, in which phase mixer 414 implements two-stage sampling as in FIG. 6. As shown in FIG. 7, the first stage of phase mixer 414 has two flip-flops 702a and 702b, while the second stage has eight flip-flops 704a-h. In addition, phase mixer 414 includes 8-to-1 multiplexer (mux) 706, and phase-select flip-flop 708.

In operation, in the first stage, flip-flop 702a samples the divided signal PH0D from feedback divider 410 based on the phase of VCO output signal PH3 to generate first-sampled signal PH3S. Similarly, flip-flop 702b samples the divided signal PH0D based on the phase of VCO output signal PH7 to generate first-sampled signal PH7S.

In the second stage, flip-flop 704a samples the first-sampled signal PH3S based on the phase of VCO output signal PH0 to generate second-sampled signal PH0SS. Similarly, each of flip-flops 704b, 704c, and 704d samples the first-sampled signal PH3S based on the phase of VCO output signals PH1, PH2, and PH3, respectively, to generate second-sampled signals PH1SS, PH2SS, and PH3SS. Similarly, flip-flop 704e samples the first-sampled signal PH7S based on the phase of VCO output signal PH4 to generate second-sampled signal PH4SS. Similarly, each of flip-flops 704f, 704g, and 704h samples the first-sampled signal PH7S based on the phase of VCO output signals PH5, PH6, and PH7, respectively, to generate second-sampled signals PH5SS, PH6SS, and PH7SS.

All eight second-sampled signals PHiSS, i=0, . . . , 7, are applied to mux 706 which, based on 3-bit phase-select signal PHSEL<2:0> from flip-flop 708, selects one of those signals to apply to PD 402 of FIG. 4 as feedback signal 403. Phase-select flip-flop 708 samples the 3-bit phase-select control signal $F_{out}$ generated by fractional accumulator 412 based on the trailing (e.g., falling) edge of the last second-sampled signal PH7SS. As shown in FIG. 6, immediately following the trailing edge of PH7SS, all eight second-sampled signals are low. As such, triggering flip-flop 708 based on the falling edge of PH7SS helps to ensure glitch-less phase-select control.

In the particular implementation of FIGS. 6 and 7, in the first stage, the divided signal PH0D is sampled based on the phase of the VCO output signals PH3 and PH7 to generate PH3S and PH7S, and, in the second stage, (i) PH3S is itself sampled based on the phases of a first set of VCO output signals PH0, PH1, PH2, and PH3 to generate four of the eight phase-offset divided signals applied to mux 706, and (ii) PH7S is itself sampled based on the phases of a second set of VCO output signals PH4, PH5, PH6, and PH7 to generate the other four phase-offset divided signals applied to mux 706. Those skilled in the art will appreciate that alternative implementations are possible, including those that sample the divided signal PH0D using one, two, or even more different VCO output signals in the first stage and/or sample the one or more first-sampled signals using one, two, or even more different sets of the VCO output signals in the second stage. Similarly, although flip-flop 708 samples based on the falling edge of PH7SS, in other implementations, other signals and/or rising edges can be used to trigger flip-flop 708.

Furthermore, embodiments may be implemented for any number F of VCO output signals, wherein F>1. In theory, the invention could also be implemented with more than two stages, although two-stage implementations have the lowest complexity and appear to fulfill all of the needs.

Although phase mixer 414 has been described in the context of a fractional-N PLL, those skilled in the art will understand that phase mixers based on the same principles as phase mixer 414 can be implemented in other contexts for other purposes. For example, a similar phase mixer can be implemented in a spread-spectrum PLL.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer. For example, the fractional accumulator can be implemented in the digital domain in hardware or software.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

We claim:

1. A signal generator comprising:
   a main signal path adapted to generate, based on a feedback signal, a plurality of phase-shifted output signals; and
   a feedback signal path adapted to generate the feedback signal for the main signal path, wherein the feedback signal path comprises:
   a divider adapted to divide a divider input signal by a divisor value to generate a divider output signal;

a phase circuit adapted to select a phase-circuit output signal from a plurality of phase-shifted signals; and an accumulator adapted to generate (1) a divider control signal for controlling selection of the divisor value used by the divider and (2) a phase-circuit control signal for controlling selection of the phase-circuit output signal by the phase circuit, wherein the accumulator is adapted to:

recieve one or more control signals corresponding to an accumulator increment value;

accumulate a counter value based on the accumulator increment value; and divide the counter value by the number of phase-shifted output signals to generate the divider control signal and the phase-circuit control signal.

2. The invention of claim 1, wherein the main signal path comprises:

a phase detector adapted to generate an error signal based on a phase difference between the feedback signal and a reference signal; and a voltage-controlled oscillator (VCO) adapted to generate the plurality of phase-shifted output signals based on a voltage control signal that depends on the error signal.

3. The invention of claim 2, wherein the main signal path further comprises:

a charge pump adapted to generate charge quantities based on the error signal; and a loop filter adapted to accumulate the charge quantities to generate the voltage control signal.

4. The invention of claim 1, wherein the signal generator is a PLL.

5. The invention of claim 4, wherein the PLL is a fractional-N PLL.

6. The invention of claim 1, wherein:

the phase-circuit control signal instructs the phase circuit to select the phase-circuit output signal based on an integer portion of a remainder resulting from applying an integer division operation to the accumulator counter value using the number of phase-shifted output signals; and the divider control signal instructs the divider to adjust the divisor value when the phase of the selected phase-circuit output signal rolls over.

7. The invention of claim 1, wherein:

the phase circuit is a phase selector adapted to receive the plurality of phase-shifted output signals from the main signal path and select one of the phase-shifted output signals based on the phase-circuit control signal; and the divider is adapted to receive the selected phase-shifted output signal from the phase selector and generate the feedback signal as the divider output signal based on the divider control signal.

8. The invention of claim 1, wherein:

the divider is adapted to receive one of the phase-shifted output signals from the main signal path and generate the divider output signal based on the divider control signal; and the phase circuit is a phase mixer adapted to:

receive the plurality of phase-shifted output signals from the main signal path and the divider output signal from the divider;

generate a plurality of phase-shifted divided signals; and select one of the phase-shifted divided signals based on the phase-circuit control signal to generate the feedback signal as the selected phase-circuit output signal.

9. The invention of claim 8, wherein the phase mixer comprises:

a first sampling stage adapted to sample the divider output signal based on one or more of the phase-shifted output signals to generate one or more first-sampled signals;

a second sampling stage adapted to sample the one or more first-sampled signals based on the phase-shifted output signals to generate a plurality of second-sampled signals, wherein the plurality of phase-shifted divided signals is based on the plurality of second-sampled signals; and a multiplexer adapted to receive the plurality of phase-shifted divided signals and select one of the phase-shifted divided signals as the feedback signal based on the phase-circuit control signal.

10. The invention of claim 9, wherein operation of the multiplexer is based on timing of one of the phase-shifted divided signals.

11. The invention of claim 9, wherein the phase mixer further comprises a phase-select device adapted to apply the phase-circuit control signal to the multiplexer.

12. The invention of claim 11, wherein the phase-select device is triggered based on an edge of one of the phase-shifted divided signals that is opposite to edges used to trigger the second sampling stage.

13. The invention of claim 1, wherein:

the signal generator is a fractional-N PLL;

the main signal path comprises:

a phase detector adapted to generate an error signal based on a phase difference between the feedback signal and a reference signal;

a voltage-controlled oscillator (VCO) adapted to generate the plurality of phase-shifted output signals based on a voltage control signal that depends on the error signal;

a charge pump adapted to generate charge quantities based on the error signal; and a loop filter adapted to accumulate the charge quantities to generate the voltage control signal;

the phase-circuit control signal instructs the phase circuit to select the phase-circuit output signal based on an integer portion of a remainder resulting from applying an integer division operation to the accumulator counter value using the number of phase-shifted output signals;

the divider control signal instructs the divider to adjust the divisor value when the phase of the selected phase-circuit output signal rolls over;

the divider is adapted to receive one of the phase-shifted output signals from the main signal path and generate the divider output signal based on the divider control signal;

the phase circuit is a phase mixer adapted to:

receive the plurality of phase-shifted output signals from the main signal path and the divider output signal from the divider;

generate a plurality of phase-shifted divided signals; and select one of the phase-shifted divided signals based on the phase-circuit control signal to generate the feedback signal as the selected phase-circuit output signal; and the phase mixer comprises:

a first sampling stage adapted to sample the divider output signal based on one or more of the phase-shifted output signals to generate one or more first-sampled signals;

a second sampling stage adapted to sample the one or more first-sampled signals based on the phase-shifted output signals to generate a plurality of second-sampled signals, wherein the plurality of phase-shifted divided signals is based on the plurality of second-sampled signals;

a multiplexer adapted to receive the plurality of phase-shifted divided signals and select one of the phase-shifted divided signals as the feedback signal based on the phase-circuit control signal, wherein operation of the multiplexer is based on timing of one of the phase-shifted divided signals; and a phase-select device adapted to apply the phase-circuit control signal to the multiplexer, wherein the phase-select device is triggered based on an edge of one of the phase-shifted divided signals that is opposite to edges used to trigger the second sampling stage.

14. An integrated circuit comprising a signal generator, the signal generator comprising:

a main signal path adapted to generate, based on a feedback signal, a plurality of phase-shifted output signals; and a feedback signal path adapted to generate the feedback signal for the main signal path, wherein the feedback signal path comprises:

a divider adapted to divide a divider input signal by a divisor value to generate a divider output signal;

a phase circuit adapted to select a phase-circuit output signal from a plurality of phase-shifted signals; and an accumulator adapted to generate (1) a divider control signal for controlling selection of the divisor value used by the divider and (2) a phase-circuit control signal for controlling selection of the phase-circuit output signal by the phase circuit, wherein the accumulator is adapted to:

receive one or more control signals corresponding to an accumulator increment value;

accumulate a counter value based on the accumulator increment value; and divide the counter value by the number of phase-shifted output signals to generate the divider control signal and the phase-circuit control signal.

15. The invention of claim 14, wherein the signal generator is a PLL.

16. The invention of claim 15, wherein the PLL is a fractional-N PLL.

17. The invention of claim 14, wherein the phase-circuit control signal instructs the phase circuit to select the phase-circuit output signal based on an integer portion of a remainder resulting from applying an integer division operation to the accumulator counter value using the number of phase-shifted output signals; and the divider control signal instructs the divider to adjust the divisor value when the phase of the selected phase-circuit output signal rolls over.

18. The invention of claim 14, wherein:

the phase circuit is a phase selector adapted to receive the plurality of phase-shifted output signals from the main signal path and select one of the phase-shifted output signals based on the phase-circuit control signal; and the divider is adapted to receive the selected phase-shifted output signal from the phase selector and generate the feedback signal as the divider output signal based on the divider control signal.

19. The invention of claim 14, wherein:

the divider is adapted to receive one of the phase-shifted output signals from the main signal path and generate the divider output signal based on the divider control signal; and the phase circuit is a phase mixer adapted to:

receive the plurality of phase-shifted output signals from the main signal path and the divider output signal from the divider;

generate a plurality of phase-shifted divided signals; and select one of the phase-shifted divided signals based on the phase-circuit control signal to generate the feedback signal as the selected phase-circuit output signal.

20. A signal generator comprising:

a main signal path adapted to generate, based on a feedback signal, a plurality of phase-shifted output signals; and a feedback signal path adapted to generate the feedback signal for the main signal path, wherein the feedback signal path comprises:

a divider adapted to divide a divider input signal by a divisor value to generate a divider output signal;

a phase circuit adapted to select a phase-circuit output signal from a plurality of phase-shifted signals; and an accumulator adapted to generate (1) a divider control signal for controlling selection of the divisor value used by the divider and (2) a phase-circuit control signal for controlling selection of the phase-circuit output signal by the phase circuit, wherein:

the accumulator supports conversion of frequency to phase by generating a current counter value by summing, at a rate based on a reference frequency, (i) a previous counter value and (ii) an accumulator increment value having an integer part and a fractional part;

the divider control signal and the phase-circuit control signal are generated from the current counter value;

the phase circuit is a phase selector adapted to receive the plurality of phase-shifted output signals from the main signal path and select one of the phase-shifted output signals based on the phase-circuit control signal; and the divider is adapted to receive the selected phase-shifted output signal from the phase selector and generate the feedback signal as the divider output signal based on the divider control signal.

21. A signal generator comprising:

a main signal path adapted to generate, based on a feedback signal, a plurality of phase-shifted output signals; and a feedback signal path adapted to generate the feedback signal for the main signal path, wherein the feedback signal path comprises:

a divider adapted to divide a divider input signal by a divisor value to generate a divider output signal;

a phase circuit adapted to select a phase-circuit output signal from a plurality of phase-shifted signals; and an accumulator adapted to generate (1) a divider control signal for controlling selection of the divisor value used by the divider and (2) a phase-circuit control signal for controlling selection of the phase-circuit output signal by the phase circuit, wherein:

the divider is adapted to receive one of the phase-shifted output signals from the main signal path and generate the divider output signal based on the divider control signal;

the phase circuit is a phase mixer adapted to:

receive the plurality of phase-shifted output signals from the main signal path and the divider output signal from the divider;

generate a plurality of phase-shifted divided signals; and select one of the phase-shifted divided signals based on the phase-circuit control signal to generate the feedback signal as the selected phase-circuit output signal; and the phase mixer comprises:
- a first sampling stage adapted to sample the divider output signal based on one or more of the phase-shifted output signals to generate one or more first-sampled signals;
- a second sampling stage adapted to sample the one or more first-sampled signals based on the phase-shifted output signals to generate a plurality of second-sampled signals, wherein the plurality of phase-shifted divided signals is based on the plurality of second-sampled signals; and
- a multiplexer adapted to receive the plurality of phase-shifted divided signals and select one of the phase-shifted divided signals as the feedback signal based on the phase-circuit control signal.

22. The invention of claim 21, wherein operation of the multiplexer is based on timing of one of the phase-shifted divided signals.

23. The invention of claim 21, wherein the phase mixer further comprises a phase-select device adapted to apply the phase-circuit control signal to the multiplexer.

24. The invention of claim 23, wherein the phase-select device is triggered based on an edge of one of the phase-shifted divided signals that is opposite to edges used to trigger the second sampling stage.

* * * * *